（12）United States Patent
Lim et al.

(10) Patent No.: US 7,197,659 B2
(45) Date of Patent: Mar. 27, 2007

(54) GLOBAL I/O TIMING ADJUSTMENT USING CALIBRATED DELAY ELEMENTS

(75) Inventors: Chee How Lim, Hillsboro, OR (US); Keng L. Wong, Portland, OR (US); Songmin Kim, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 461 days.

(21) Appl. No.: 09/965,223

(22) Filed: Sep. 28, 2001

(65) Prior Publication Data

US 2003/0065962 A1 Apr. 3, 2003

(51) Int. Cl.
*G06F 1/12* (2006.01)
(52) U.S. Cl. ...................... 713/401; 713/400
(58) Field of Classification Search ............... 713/401, 713/400
See application file for complete search history.

(56) References Cited

U.S. PATENT DOCUMENTS

| 4,021,740 | A | | 5/1977 | Horna | 328/29 |
|---|---|---|---|---|---|
| 5,457,698 | A | | 10/1995 | Segawa et al. | 371/223 |
| 5,636,249 | A | * | 6/1997 | Roither | 375/282 |
| 5,742,798 | A | * | 4/1998 | Goldrian | 713/400 |
| 5,818,270 | A | * | 10/1998 | Hamza | 327/116 |
| 5,977,837 | A | * | 11/1999 | Byrn et al. | 331/1 A |
| 6,014,177 | A | * | 1/2000 | Nozawa | 348/540 |
| 6,157,231 | A | | 12/2000 | Wasson | 327/156 |
| 6,259,295 | B1 | * | 7/2001 | Kriz et al. | 327/296 |
| 6,337,590 | B1 | * | 1/2002 | Millar | 327/158 |
| 6,356,122 | B2 | * | 3/2002 | Sevalia et al. | 327/105 |

* cited by examiner

*Primary Examiner*—Rehana Perveen
*Assistant Examiner*—Tse Chen
(74) *Attorney, Agent, or Firm*—Blakely, Sokoloff, Taylor & Zafman LLP

(57) ABSTRACT

A method transfers a signal from a transmitting device to a receiving device. The signal is output from the transmitting device using a driving circuit. A reference clock signal is received in the transmitting device. An output clock signal is generated according to the received reference clock signal and a feedback clock signal in a phase locked loop. A delay is provided in a path of the reference clock signal and a path of the feedback clock signal. The delay is configured to make the output signal meet a predetermined valid data timing requirement.

20 Claims, 8 Drawing Sheets

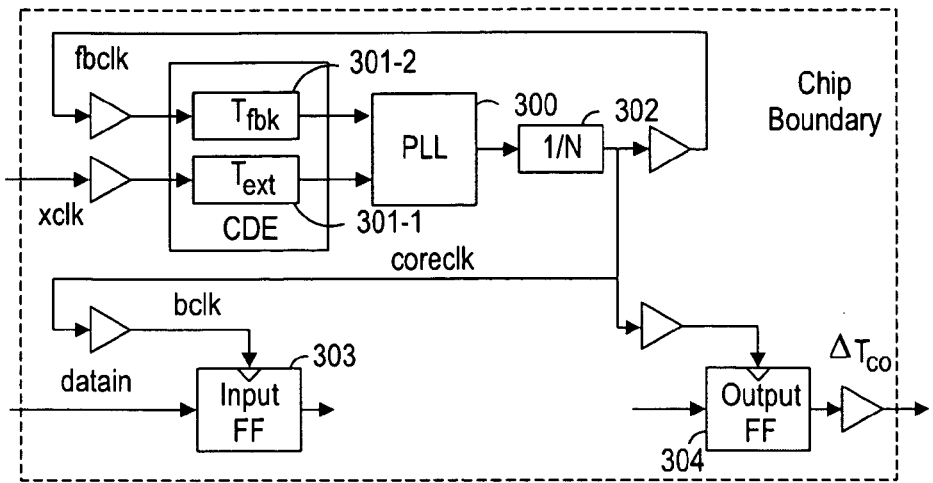
FIG. 3
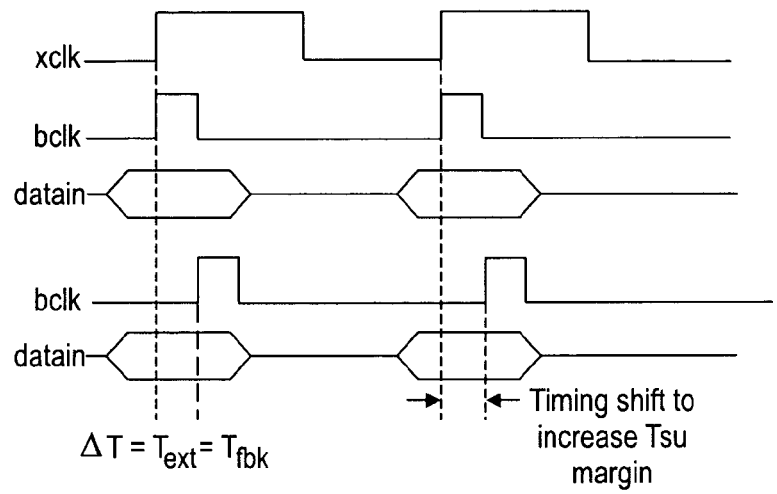
FIG. 4
| Fix | Margin On | Action | Add $\Delta T_{co}$ |
|---|---|---|---|
| Tsu | Tco,max,Th | $\pi_{ext}$ | - |
| Th | Tco,min,Tsu | $\pi_{fbk}$ | - |
| Th | - | $\pi_{fbk}$ | Yes |
| Tco,max | Tsu | $\pi_{fbk}$ | - |
| Tco,min | Th | $\pi_{ext}$ | - |
| Tco,min | - | $\pi_{ext}$ | Yes |
FIG. 5

| Ⓐ | : Pwrgd |
| B | : (!CDElock·PLLlock) + !PLLlock |
| C | : CDElock·PLLlock·FSMen |
| D | : PLLlock·!FSMen |
| E | : !TapEqFuse·!Mlock |
| F | : !TapEqFuse·Mlock |
| G | : TapEqFuse |
| H | : PLLlock |
| OUT1 | : if (FSMen), Tap = 000; Else Tap = Fuse Value |
| OUT2 | : Tap = Fuse Value |
| OUT3 | : Tap = Tap + 1 |

| Condition | Voltage | Bias Code |
|---|---|---|
| 95nm, 95°C | 1.10V | 1000101 |
| (Slow) | 1.25V | 0110011 |
|  | 1.40V | 0101100 |
| Condition | Voltage | Bias Code |
|---|---|---|
| 75nm, 5°C | 1.10V | 0101110 |
| (Fast) | 1.25V | 0100101 |
|  | 1.40V | 0011101 |
FIG. 15
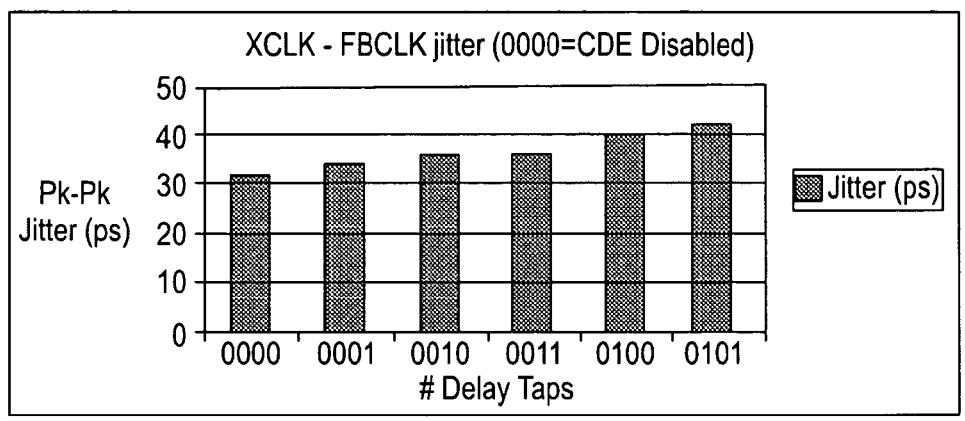
FIG. 16
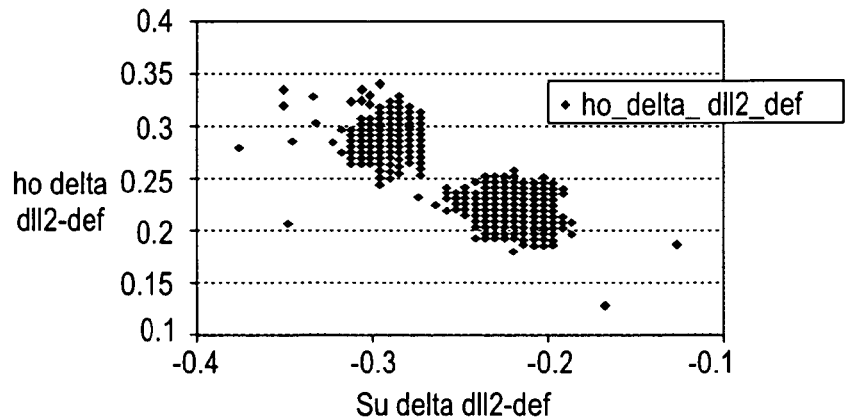
FIG. 17

US 7,197,659 B2

GLOBAL I/O TIMING ADJUSTMENT USING CALIBRATED DELAY ELEMENTS

FIELD

The present invention is directed to timing adjustment using delay elements. More particularly, the present invention is directed to a delay arrangement wherein a global I/O timing adjustment is provided via calibrated delay elements.

BACKGROUND

FIG. 1 illustrates a high speed digital system 100 including a drive circuit 110 receiving a signal SIG and outputting a signal to receive circuit 130 via an existing connection circuit 120 and connectors C, such drive circuit 110 and receive circuit 130 being driven by a common clock signal CLK provided along a clock line 140. The components within the drive circuit 110 and receive circuit 130 (e.g., both which may be implemented via IC chips) are manufactured to have sub-micron dimensions and micron spacings between such components, and accordingly, signal propagation time from one internal IC element to another internal IC element is substantially negligible. As a result, the internal IC circuits operate at extremely high speeds, e.g., chips typically now operate with internal clock speeds in excess of 100 MHz. The present invention arises from the problem that external component spacings outside of the ICs (e.g., spacing between IC chips) are not matching the component spacings within ICs making it difficult if not impossible to manage synchronization with respect to downstream signals.

In a system, there may be physical limitations as to how closely spaced a drive circuit 110 and a receive circuit 130 can be placed. More specifically, in highly dense systems having a plurality of interconnected printed circuit boards (PCBs) with several tens/hundreds of IC chips, a tremendous number of interconnection lines, numerous connectors and several hundreds/thousands of supporting components (e.g., resistors, capacitors, inductors, etc.), a drive circuit 110 and a receive circuit 130 may need to be spaced at a substantial distance D (e.g., up to ten to fifteen inches) from one another. Resultant signal propagation along the substantial distance D, and especially through connectors C and any existing circuit 120 may cause a propagating signal not to meet a setup time of the receive circuit 130, i.e., cause a synchronization mismatch between the drive and receive circuits.

More specifically, assuming that the signal SIG is processed and output by drive circuit 110 at a time t=0 (FIG. 2) coincident with a first clock pulse 242 of a 100 MHz (i.e., megahertz) clock having 10 ns (i.e., nanoseconds) clock periods, and does not arrive at an input of receive circuit 130 until 13 ns later, such signal cannot be input into receive circuit 130 upon occurrence of the second clock pulse 244, i.e., it arrives too late at the receive circuit. As a further problem, it is unlikely that such output signal will remain prevalent (i.e., valid) at an input to receive circuit 130 for another 6–7 ns so as to be available for capturing by receive circuit 130 upon occurrence of a third clock pulse 246. Accordingly, a window of availability of the propagated output signal at the input of receive circuit 130 does not match a predetermined setup time window required by receive circuit 130.

In high-speed I/O designs, the timing specifications allow for very little variation. The timing allocation for each component comes from estimates that are susceptible to errors. These allocations are sometimes altered after the design is completed to remedy violations. As the designs become increasingly complex and the design process becomes shorter, it is important to add features that allow corrections after IC chips are connected whenever necessary. These capabilities permit the design to be tuned in the face of uncertainties due to aggressive process scaling as well as ever changing product specifications.

A first solution skews the on-board clock routing to the transmitter and receiver chips with respect to each other once the systematic timing offset is known. The advantage to this solution is that the routing skews are quite constant across manufacturing conditions, but this requires additional board re-designs that slows the design process. In a second solution, on-chip delay buffers are added or removed from the transmitter or receiver chips in the data path to shift the timings. The advantage to this approach is that it does not require board re-designs, but it consumes a lot of space (i.e., in all I/O pad cells). In addition, since the cost of compensating these buffers would be astronomical, these non-compensated buffers will suffer from process, voltage, and temperature (PVT) variations. The delay buffers can be placed into the common clock path to remedy the penalty area. Again, these non-compensated delay buffers suffer from PVT variations that help one timing component, such as 200 ps setup time margin gain, but costs another timing component dearly, such as 400 ps hold time margin loss.

BRIEF DESCRIPTION OF THE DRAWING(S)

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein:

FIG. 3 is a high-level block diagram of an example embodiment of the present invention, including self-calibrating delay cells;

FIG. 4 is a waveform diagram illustrating the timing shift effect of the example embodiment shown in FIG. 3;

FIG. 5 is a timing adjustment table for the example embodiment of the invention shown in FIG. 3;

FIG. 15 is a table of an example lock range of the self-calibrating delay cell across PVT variations in the example embodiment;

FIG. 16 is a graph illustrating the PLL jitter across taps of the self-calibrating delay cell in the example embodiment; and FIG. 17 is a graph of the setup and hold time shift in the example embodiment of the invention.

DETAILED DESCRIPTION

Figure 1:
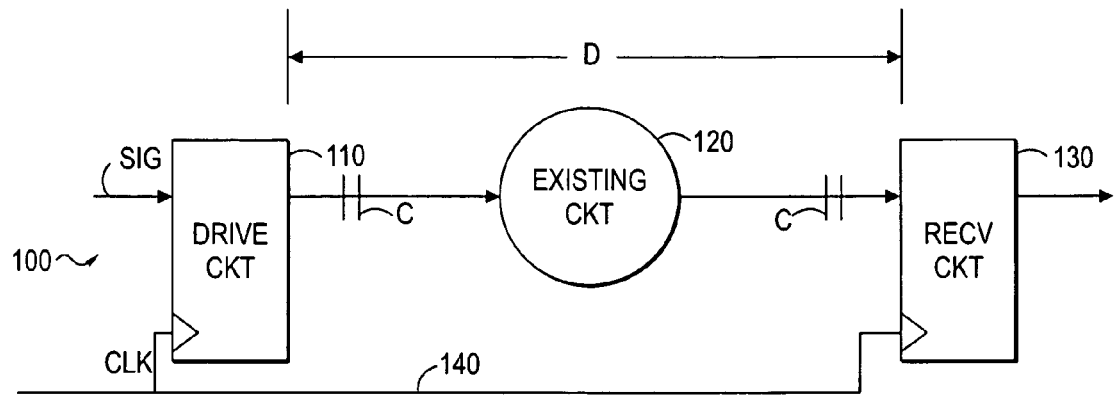
FIG. 1 is a block diagram illustration of a high speed digital system for background discussion.
Figure 2:
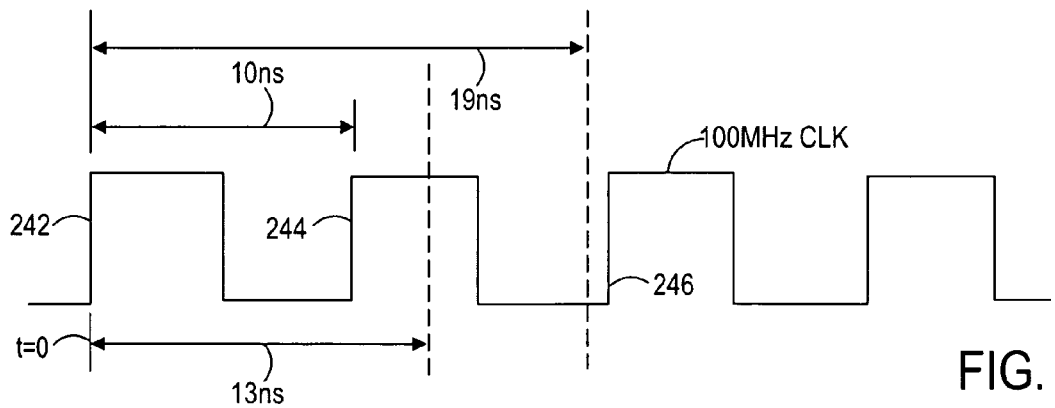
FIG. 2 is a clock signal waveform used for description of the high speed digital system illustrated in FIG. 1.

Before beginning a detailed description of the subject invention, mention of the following is in order. When appropriate, like reference numerals and characters may be used to designate identical, corresponding or similar components in differing figure drawings. Further, in the detailed description to follow, example sizes/values/ranges may be given, although the present invention is not limited to the same. Example arbitrary axes (e.g., X-axis, Y-axis and/or Z-axis) may be discussed/illustrated, although practice of embodiments of the present invention is not limited thereto (e.g., differing axes directions may be able to be assigned). Still further, the clock and timing signal figures are not drawn to scale, and instead, exemplary and critical time values are mentioned when appropriate. With regard to description of any timing signals, the terms assertion and negation may be used in an intended generic sense. More particularly, such terms are used to avoid confusion when working with a mixture of "active-low" and "active-high" signals, and to represent the fact that the invention is not limited to the illustrated/described signals, but could be implemented with a total/partial reversal of any of the "active-low" and "active-high" signals by a simple change in logic. More specifically, the terms "assert" or "assertion" indicate that a signal is active independent of whether that level is represented by a high or low voltage, while the terms "negate" or "negation" indicate that a signal is inactive. As a final note, well known power/ground connections to ICs and other components are not shown for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits, flowcharts) are set forth in order to describe example embodiments of the invention, it should be apparent to one skilled in the art that the invention can be practiced without, or with variation of, these specific details.

Although example embodiments of the present invention will be described in an example computer system and environment, practice of the invention is not limited thereto, i.e., the invention may be able to be practiced with other types of systems, and in other types of environments (e.g., communications chips).

Turning now to detailed description, the example embodiments of the invention use a tuning feature after IC chips have been connected in a system design, such as on a printed circuit board of a personal computer (PC) system. It allows a set of delay elements, such as self-calibrating delay cells, to globally shift I/O timings such that transmission and reception timing characteristics can be changed with respect to an IC chip. This methodology works in a common-clock design where both the transmitter and receiver chips are synchronized by the same clock driver. For example, for a given bus topology, if there is a systematic setup time violation at the receiver, the self-calibrating delay cells can be activated to delay the receiver's clock path with respect to its data path to eliminate this violation.

The example embodiments have a main technical advantage over other approaches discussed in the Background. The delay cells are self-calibrated using a digital compensation technique that reduce PVT variation without incurring large area penalty. This allows post-silicon adjustments to eliminate systematic timing violations without suffering from overall timing window degradation.

FIG. 3 illustrates the invention from a high-level perspective. In this block diagram, calibrated delay elements (labeled as CDE) are strategically located in the reference and feedback clock paths of a phase locked loop (PLL) 300. As a result, the input and output timings can be systematically shifted with respect to the external clock (xclk). Since PLL 300 provides the timing reference for the entire IC chip through 1/N frequency divider 302 (only a single Input Flip-Flop 303 and Output Flip-Flop 304 are shown in FIG. 3 for the sake of convenience), adding delay elements ($T_{ext}$) 301-1 in the path of the reference clock signal shifts the internal coreclk and bclk signals later with respect to the external xclk signal. This increases setup time margin (as shown in FIG. 4) when the chip is in the receive mode. However, since the bus period is constant, improving setup ($T_{su}$) margin in the input path also improves minimum clock-to-output ($T_{co,min}$) margin, but at the cost of hold ($T_h$) and maximum clock-to-output ($T_{co,max}$) margins in the input and output paths, respectively.

The calibrated delay elements 301-1 and 301-2 allow the margins to be shifted without growing the timing window ($T_{su}+T_h$ input window or $T_{co,min}+T_{co,max}$ output window). In present day high-speed I/O design, growing the timing window hurts the overall timing balance, and translates the timing violation from one component to another. There are some guidelines as to the situation when global timing adjustments are appropriate as shown in FIG. 5.

Figure 6A:
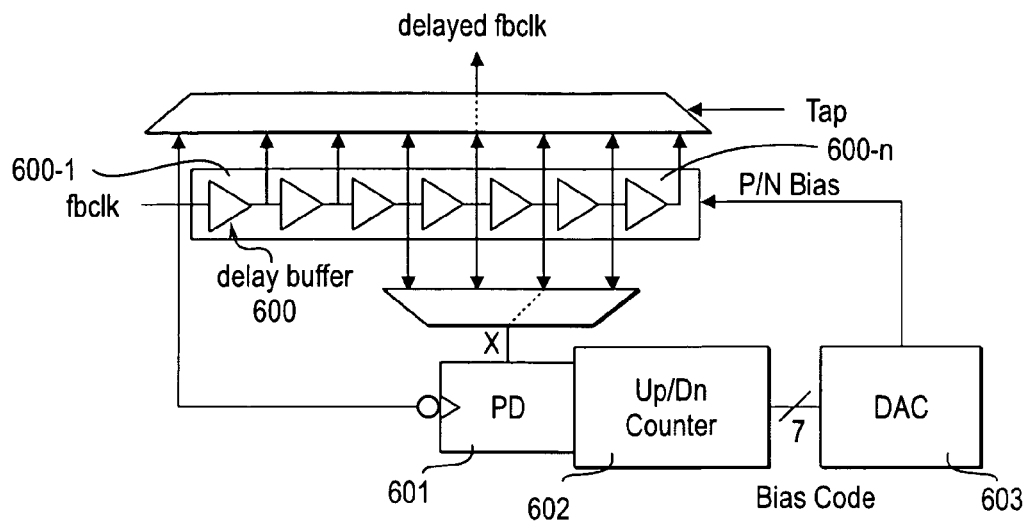
FIG. 6A is a block diagram of the internal compensation loop in the example embodiment.
Figure 6B:
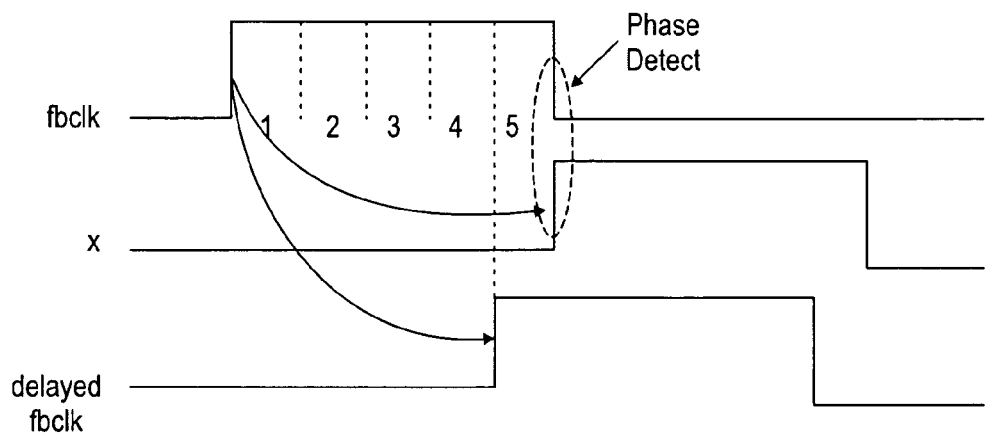
FIG. 6B is a waveform diagram of the digital compensation technique in the example embodiment.

FIG. 6A shows the block diagram of a preferred self-calibrating delay cell utilizing a digital compensation technique that keeps the delay cells from PVT variation (i.e. providing a continuous calibration mechanism). In this technique, the feedback (fbclk) clock pulse from FIG. 3 is used as the reference signal to the compensation circuit. The falling edge of this signal is phase-aligned to the delayed rising edge (x). To align the edges, the output of the phase detector (PD) 601 tells the Up/Down counter 602 whether the x is early or late with respect to the fbclk falling edge. If early, Up/Down counter 602 will increment its binary code, and the digital-to-analog (DAC) converter 603 will produce a higher voltage that increases the delay of the delay buffer 600. If late, Up/Down counter 602 will increment its value and hence causes the delay to reduce. This process repeats continuously to phase-align the edges. The phase alignment is illustrated in FIG. 6B, and the dotted lines in FIG. 6A indicate the delay taps that are available to provide the fine delay granularity for I/O tuning. As an example, the delayed fbclk signal, which feeds to PLL 300, is shown to be delayed by 4 buffers, while the phase alignment occurs with 5 buffers. Since this circuit is simplistic in nature and highly digitized, the area cost is small, and it only occurs in only one location of the die.

Figure 9:
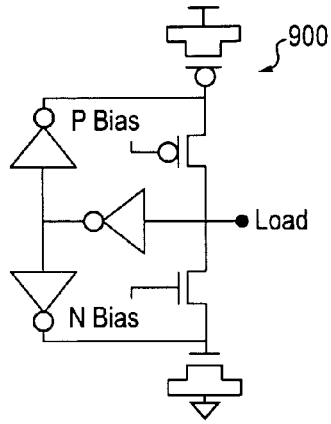
FIG. 9 is a diagram of an example of the delay cell in the example embodiment shown in FIG. 3.
Figure 10:
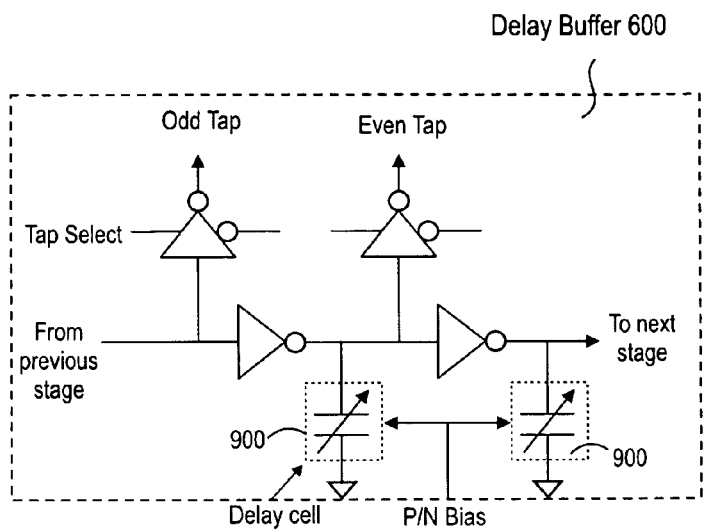
FIG. 10 is a diagram of an example of the delay buffer in the example embodiment shown in FIG. 3.
Figure 11:
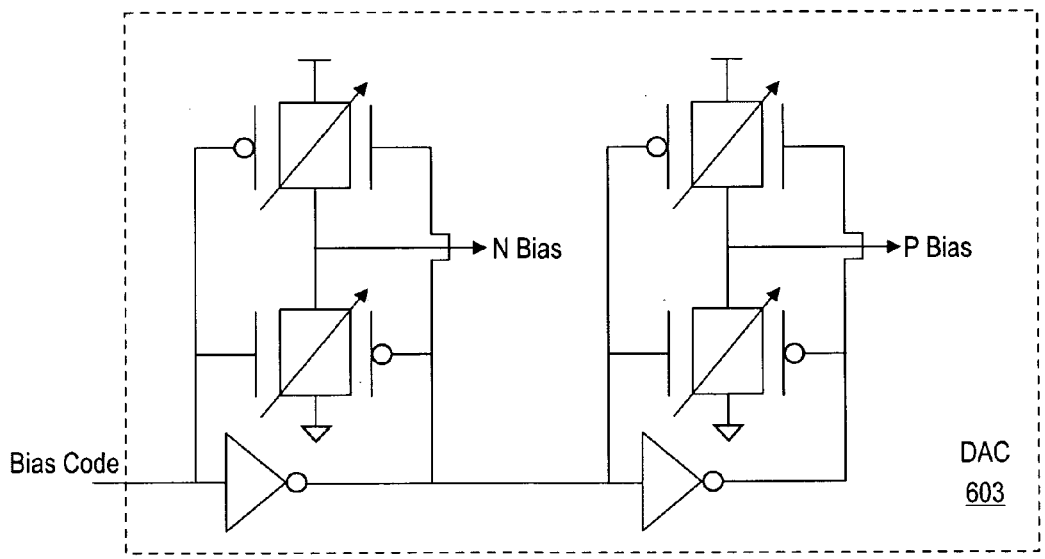
FIG. 11 is a diagram of an example of a Digital-to-Analog converter in the example embodiment shown in FIG. 3.

Example implementations of various parts of the circuit is illustrated in FIGS. 9–11. However, the circuit is of course not limited to such an implementation. FIG. 9 illustrates an example of a single delay cell in the stages 600-1 to 600-n of delay buffer 601. The delay cell 900 receives the P/N bias from DAC 603 in FIG. 6. (An example of DAC 603 is shown in FIG. 11.) FIG. 10 illustrates how a plurality of such delay cells 900 (shown with a diagonal arrow to indicate that they are variable to adapt to, e.g., PVT variations. As shown, there are a plurality of selectable taps corresponding to stages 600-1 to 600-n of delay buffer 600.

Figure 12:
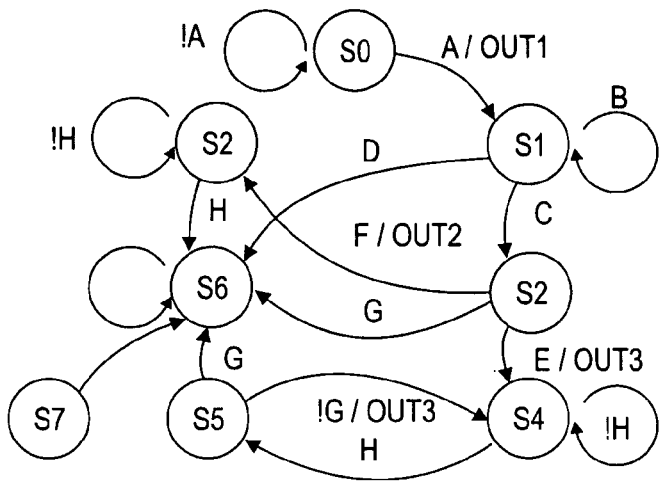
FIG. 12 is a state transition diagram of the lock sequence state machine in the example embodiment.
Figures 13, 14:
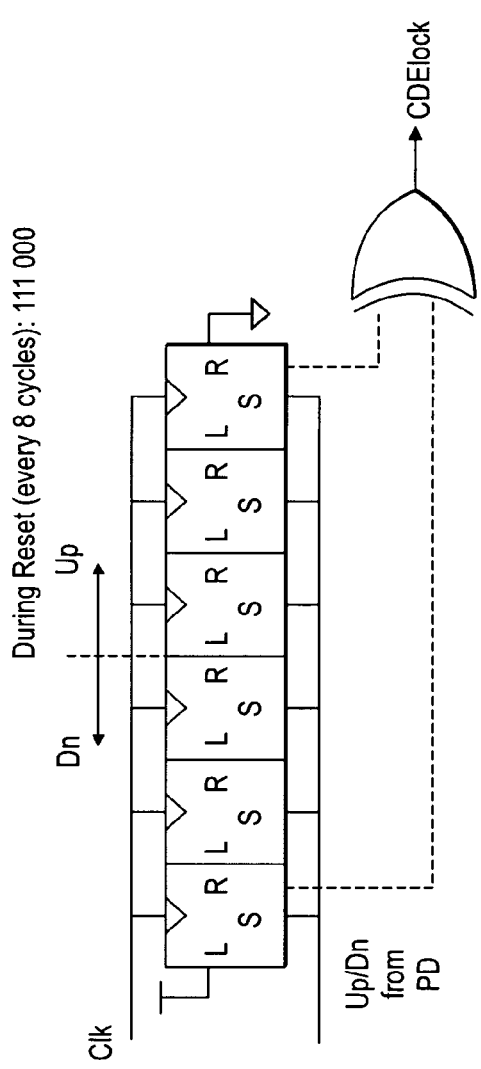
FIG. 13 is a diagram of an example of a lock detector for the self-calibrating delay cell in the example embodiment.
FIG. 14 is a diagram of a lock indicator deglitching circuit in the example embodiment.

Because of the loop circuit in the example self-calibrating delay cell, there is the potential for tuning errors. There will be a certain amount of jitter across the taps of delay buffer 600 as shown in FIG. 16. A lock detector and a lock indicator deglitching circuit may be provided to ensure that the loop circuit does not become stuck at an improper value. FIG. 12 shows a state transition diagram of a lock sequence state machine for the loop circuit. FIG. 13 shows an example of a lock detector for delay buffer 600. FIG. 14 shows an example of a lock indicator deglitching circuit. Of course, there are specified operating conditions within which the circuit must operate and FIG. 15 is a table showing bias codes for examples of the lock range across PVT variations.

Figure 7:
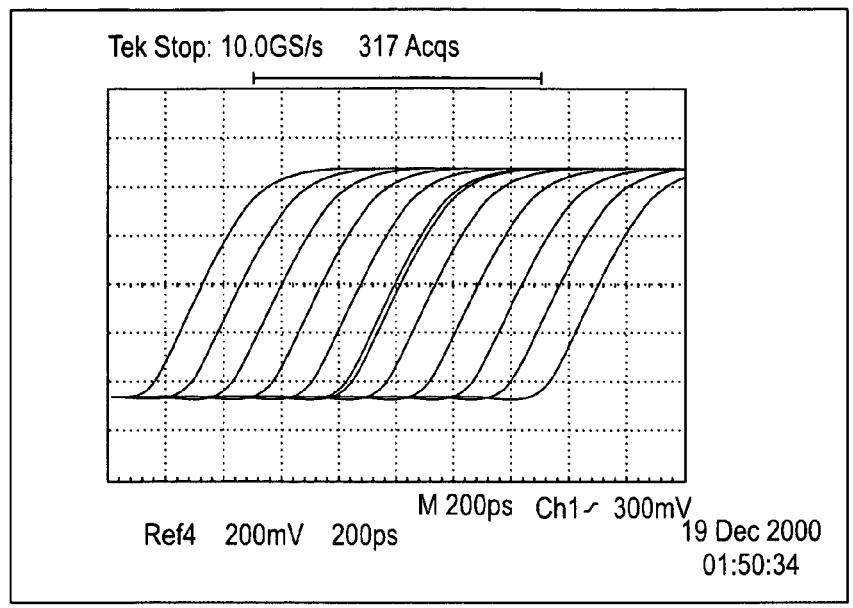
FIG. 7 is a graph illustrating the timing shifts at the PLL inputs of the example embodiment.
Figure 8:
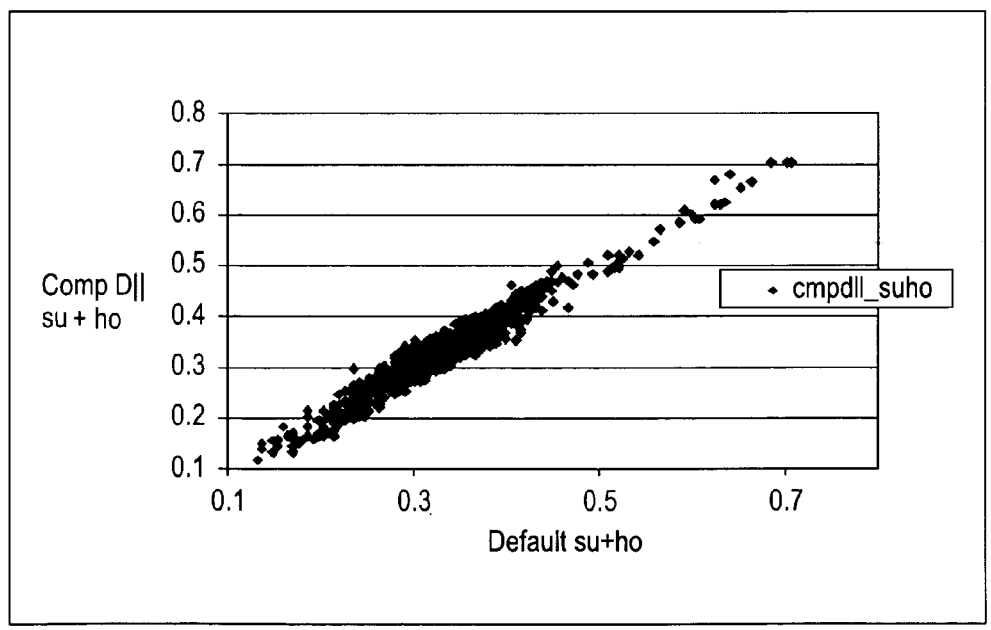
FIG. 8 is a graph illustrating the setup and hold time window across pins in the example embodiment.

FIG. 7 shows the resulting timing shifts at the inputs of PLL 300. The reference clock signal at the center of FIG. 7 is shown with the feedback clock signals shifted in 130 ps granularity. FIG. 8 shows that the pin-to-pin setup and hold timing window remains constant with a timing shift of 2 delay cells (260 ps). These two figures show that I/O timing can be shifted without affecting the timing window. FIG. 17 shows the setup and hold time shift in the example embodiments.

Although a variety of different embodiments are described above, they all provide a flexible and cost-effective way to adjust I/O timings to meet product timing specifications after IC chips have been mounted. The placement of the delay cells only in the input paths of PLL 300 shifts the global timing of the chip with little impact on the amount of area available on an IC chip for other components. In particular, the delay cells calibrate themselves to meet specified timing adjustment granularity and range.

Although not shown for the sake of simplicity, the example embodiments may be implemented in a system including the similar components as FIG. 1. Indeed, the disclosed embodiments and other embodiments of the present invention may be practiced in all types of systems, including, but not limited to, computing systems, non-computing systems, communication systems, etc. The IC chip may be any kind of chip with I/O requirements, including, but not limited to, microprocessors, north bridge, south bridge, memory controller hub, I/O controller hub, an application specific integrated circuit (ASIC), a data interface buffer (DIB) acting as both a transmitting and receiving circuit, and a dynamic random access memory (DRAM) or dual in-line memory module (DIMM) (or other memory type) acting as both a receiving and transmitting circuit.

In actual practice, there may be a single PCB or multiple interconnected PCBs or a multi-layer PCB in a system (such as a server) having an extremely complex system having a layout and components which dictate the spacing between transmitting/receiving IC pairs. There may be a PCB component which is a connector that intervenes and prevents the transmitting device and receiving device from being placed any closer together. Further, a signal propagation path between the devices may vary during the design process, taking into consideration intervening components such as a connector.

While a trend in the art has been to attempt to minimize distances between ICs, the present invention takes a non-obvious approach of increasing an effective signal propagation distance between ICs, i.e., adds delay to the clock signal propagation path synchronizes the drive circuit 110 (in a transmitting device) and a receive circuit 130 (in a receiving device) in order to provide phase delayed synchronization such that downstream signal management is improved. Without phase delayed synchronization, downstream signal management may not be possible due to difficult or impossible management of valid data input timing requirements such as setup and hold times.

The example embodiments of the present invention allow longer propagation paths (i.e., PCB conduction line) while still providing signal propagation match (phase delay synchronize) between the transmitting device and the receiving device. That is, they provide a timing adjustment such that a signal arrival and availability of the signal at a receiving circuit input matches valid data timing input requirements of the receiving circuit.

As a result of the example embodiments, there is little need to minimize PCB spacing distances between clock and transmitting/receiving c12 circuit pairs, and accordingly, design of complex systems becomes easier as there is more freedom to move sending/receiving components apart to greater separation distances. Second, since there is a direct correlation between PCB conduction line length and delay (e.g., 12 inches of PCB conduction line length~2 ns of phase synchronization delay), design of complex systems becomes easier. Third, since great numbers of further components and their corresponding clock lines and power connection lines are avoided, the system is less complex and it is less likely that multi-layer PCBs will be required.

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any example embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

This concludes the description of the example embodiments. Although the present invention has been described with reference to a number of example embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A timing circuit comprising:
    at least one driving circuit outputting an output signal onto a first interconnect;
    at least one receiving circuit receiving an input signal from a second interconnect;
    a phase locked loop receiving a reference clock signal and a delayed feedback clock signal, and supplying an output clock signal to said at least one driving circuit and said at least one receiving circuit, said phase locked loop generating said output clock signal according to said received reference clock signal and delayed feedback clock signal; and
    first and second delay elements located in the path of said reference clock signal and the path of a feedback clock signal, respectively, said first and second delay elements being configured to provide a delay in order to make said output signal meet a predetermined valid data timing requirement, wherein each of the first and second delay element comprises:
        at least one delay buffer to receive said reference clock and to generate a delayed reference clock, said reference clock having a falling edge, said delayed reference clock having a rising edge;
        a phase detector to determine whether said rising edge of said delayed reference clock is early or late with respect to said falling edge of said reference clock;
        a counter to increment if said rising edge of said delayed reference clock is early with respect to said falling edge of the reference clock and to decrement if said rising edge of said delayed reference clock is late with respect to said falling edge of said reference clock; and
        a digital-to-analog converter (DAC) coupled to receive an output from said counter, said DAC further to increase a bias applied to said delay buffer if said rising edge of said delayed reference clock is early with respect to said falling edge of said reference clock.

2. A timing circuit as claimed in claim 1, wherein delay elements are located only in the reference clock and feedback clock paths.

3. A timing circuit as claimed in claim 1, wherein said first and second delay elements are self-calibrating delay cells.

4. A timing circuit connection as claimed in claim 3, wherein said self-calibrating delay cells calibrate themselves to meet specified timing adjustment, granularity and/or range.

5. A timing circuit as claimed in claim 4, wherein said self-calibrating delay cells use a digital compensation technique to reduce process, voltage, and/or temperature (PVT) variations.

6. A timing circuit as claimed in claim 5, wherein said digital compensation technique utilizes a multi-tap delay buffer in the feedback clock signal path to delay the feedback clock signal, the amount of delay being controlled by selecting a tap of said multi-tap delay buffer.

7. A timing circuit as claimed in claim 1, wherein said at least one driving circuit comprises a plurality of driving circuits and said phase locked loop provides said output clock signal to all of said plurality of driving circuits.

8. A timing circuit as claimed in claim 7, wherein said plurality of driving circuits drive respective output signals from an integrated circuit (IC) chip.

9. An I/O circuit comprising:
    a transmitting device outputting at least one output signal, said transmitting device having:
        at least one driving circuit, the number of driving circuits corresponding to the number of output signals;
        a phase locked loop receiving a reference clock signal and a delayed feedback clock signal, said phase locked ioop generating said output clock signal according to said received reference clock signal and delayed feedback clock signal;
        first and second delay elements located in the path of said reference clock signal and the path of a feedback clock signal, respectively, wherein each of the first and second delay element comprises:
            at least one delay buffer to receive said reference clock and to generate a delayed reference clock, said reference clock having a falling edge, said delayed reference clock having a rising edge;
            a phase detector to determine whether said rising edge of said delayed reference clock is early or late with respect to said falling edge of said reference clock;
            a counter to increment if said rising edge of said delayed reference clock is early with respect to said falling edae of the reference clock and to decrement if said rising edge of said delayed reference clock is late with respect to said falling edge of said reference clock; and
            a digital-to-analog converter (DAC) coupled to receive an output from said counter, said DAC further to increase a bias applied to said delay buffer if said rising edge of said delayed reference clock is early with respect to said falling edge of said reference clock; and
    a receiving device having at least one receiving circuit receiving said at least one output signal from said transmitting device and an input signal from an interconnect, said phase locked loop supplying an output clock signal to said at least one driving circuit and said at least one receiving circuit, the timing of said received output signal or at least one output signal meeting said predetermined valid timing requirement.

10. An I/O circuit as claimed in claim 9, wherein delay elements are located only in the reference clock and feedback clock paths.

11. An I/O circuit as claimed in claim 9, wherein said first and second delay elements are self-calibrating delay cells.

12. An I/O circuit as claimed in claim 11, wherein said self-calibrating delay cells calibrate themselves to meet specified timing adjustment, granularity and/or range.

13. An I/O circuit as claimed in claim 12, wherein said self-calibrating delay cells use a digital compensation technique to reduce process, voltage, and/or temperature (PVT) variations.

14. An I/O circuit as claimed in claim 13, wherein said digital compensation technique utilizes a multi-tap delay buffer in the feedback clock signal path to delay the feedback clock signal, the amount of delay being controlled by selecting a tap of said multi-tap delay buffer.

15. An I/O circuit as claimed in claim 9, wherein said at least one driving circuit comprises a plurality of driving circuits and said phase locked loop provides said output clock signal to all of said plurality of driving circuits.

16. An I/O circuit as claimed in claim 9, wherein said transmitting device and said receiving device comprise IC chips and said output signals are driven on a bus between said integrated circuit (IC) chips.

17. An I/O circuit as claimed in claim 16, wherein said transmitting device and said receiving device are mounted at a distance from each other on a printed circuit board.

18. A method of transferring a signal from a transmitting device to a receiving device comprising:
  outputting said signal from said transmitting device using a driving circuit;
  receiving a reference clock signal in said transmitting device;
  generating an output clock signal according to said received reference clock signal and a delayed feedback clock signal in a phase locked loop;
  supplying the output clock signal to said at least one driving circuit and at least one receiving circuit; and
  providing a delay in a path of said reference clock signal and a path of said feedback clock signal to make said at least one output signal meet a predetermined valid data timing requirement by:
    receiving said reference clock at a delay element, said reference clock having a falling edge;
    generating a delayed reference clock, said delayed reference clock having a rising edge;
    determining whether said rising edge of said delayed reference clock is early or late with respect to said falling edge of said reference clock;
    incrementing a counter if said rising edge of said delayed reference clock is early with respect to said falling edge of said reference clock;
    decrementing said counter if said rising edge of said delayed reference clock is late with respect to said falling edge of said reference clock; and
    increasing a bias applied to said delay element if said rising edge of said delayed reference clock is early with respect to said falling edge of said reference clock.

19. The method recited in claim 18, wherein said delay is provided by self-calibrating delay cells which calibrate themselves to meet specified timing adjustment, granularity and/or range.

20. The method recited in claim 19, wherein said self-calibrating delay cells use a digital compensation technique to reduce process, voltage, and/or temperature (PVT) variations.

* * * * *